Dec. 27, 1966 E. W. SWANSON 3,294,906

HINGE STRUCTURE

Filed May 27. 1964 2 Sheets-Sheet 1

Inventor
Edward W. Swanson
By Nicholas A. Camasto
Atty

Dec. 27, 1966 E. W. SWANSON 3,294,906

HINGE STRUCTURE

Filed May 27, 1964 2 Sheets-Sheet 2

Inventor
Edward W. Swanson
By Nicholas A. Camasto
Atty.

3,294,906

HINGE STRUCTURE

Edward W. Swanson, Chicago, Ill., assignor to Admiral Corporation, Chicago, Ill., a corporation of Delaware Filed May 27, 1964, Ser. No. 370,629
10 Claims. (Cl. 178—7.9)

This invention relates to electrical control panels. Specifically, it relates to control panels of television receivers and the like and more specifically, to "tilt-out" control panels which have their tuning control knobs hidden within the cabinet of a television receiver when access to the control knobs is not required, and which knobs are exposed only when access thereto is desired.

While the invention will be described in the environment of a tilt-out control panel in a television receiver, it should be understood that this is merely for the convenience of description and should not be construed as a limitation thereof, since there are obviously numerous other environments in which the invention will readily find applicability.

In the past, the knobs controlling the tuning (i.e., channel selection and volume) of television receivers have generally been located on the top, side or in the front of the television cabinet. Attempts have been made to hide these control knobs by recessing the control panel and providing a retractable covering for this recess, or by movably mounting the tuner assembly and its associated control panel within the television cabinet such that the tuner assembly can be partially withdrawn from the cabinet when access to the control panel is desired.

Various methods have been used to gain access to the control panel of such a movably mounted tuner assembly. Usually, the tuner assembly is pivotally mounted within the cabinet of the television set such that when the assembly is in its in position the control panel is completely within the set, and only a faceplate, usually decoratively designed and flush with the surface of the cabinet, is visible. When the tuner assembly is in its out position, the various control knobs upon the control panel are exposed and readily accessible.

These tilt-out panels have to be very well balanced, so that when the tuner is either in its in position or out position it is in a state of stable equilibrium; that is, such that if the unit is displaced slightly from its in or out position and released, it will fall back into its original position. The unit, if properly balanced, will so act when displaced and released unless the displacement is so great that the center of gravity of the unit moves past an imaginary vertical line drawn upward from the pivot point. The unit in such an instance will fall, not to its original rest position (i.e., either to its in position or its out position), but to the opposite rest position, where it will again lie in a state of stable equilibrium.

Alternately, such tilt-out tuning assemblies have been provided with toggle springs to compensate for any unbalance in the assembly and to maintain it either in an in or an out position. The use of toggle or over-center springs is well known in the art and suffice it to say that when so provided the unit will be in an even more stable equilibrium at either of its rest positions.

If a unit provided with toggle springs were displaced slightly from its rest position, it would not merely fall back into this rest position when released, but would rather be impelled back by the restraining action of the toggle spring. Similarly, if the unit were displaced sufficiently that the toggle spring passed across the pivot point, the unit, when released would be impelled towards its other rest position.

It is obvious that the delicate components of a television tuner could not long withstand such severe jolts and, consequently, in order that a toggle mechanism be effective for use with a tilt-out control panel, the tuner components would have to be "ruggedized." Even then, the abruptness of its action would present drawbacks in marketing the unit, as consumers would be likely to disapprove of such an abrupt action.

In a commercial television set, economy of manufacture must always be considered. Such economy, however, must not detract from the reliability or quality of the set. Both of the aforementioned methods for pivotally mounting a tuner assembly such that its control panel can be alternately within and without the television cabinet necessarily involve some additional expense. In the first of the aforementioned methods, weights must be accurately positioned, and each unit individually balanced on the production line, thereby requiring a greater expenditure both of parts and of production time. In the second of the aforementioned methods, "ruggedizing" the components to enable the unit to withstand its being snapped into each rest position would require the use of far more expensive components. In each of these cases, the momentum gained by the assembly in falling into its rest position would cause an undesirable abruptness of action, which abruptness this invention eliminates.

The invention discloses means whereby a tuner assembly can be pivotally mounted such that its control panel and the associated knobs are alternately hidden from view or accessible to the viewer, the unit being completely reliable in its operation and economical in its manufacture, and whereby the movement of the tuner between its two alternate positions is smooth and is effected with a minimum of effort.

Consequently, it is an object of this invention to provide a novel tilt-out control panel for a television receiver.

Another object of this invention is to provide a tilt-out control panel which will compensate for the uneven distribution of weight within is associated tuner assembly.

Still another object of this invention is to provide a tilt-out control panel which is economical in its manufacture.

Yet another object of the invention is to provide a tilt-out control panel for a television receiver which displays the tuner functions while the control panel is hidden within the cabinet of the television set.

A further object of the invention is to provide a tilt-out control panel with a control spring which will partially inhibit the action of a toggle spring within its hinge mechanism.

A still further object of the invention is to provide a tilt-out control panel wherein the tensions on its toggle spring and control spring are mechanically adjustable.

A yet further object of the invention is to provide a universal hinge structure which will enhance movement of various loadings between two rest positions.

Other objects of the invention will become apparent upon reading the specification in conjunction with the drawings in which.

Figures 1, 7, 8, 9A:
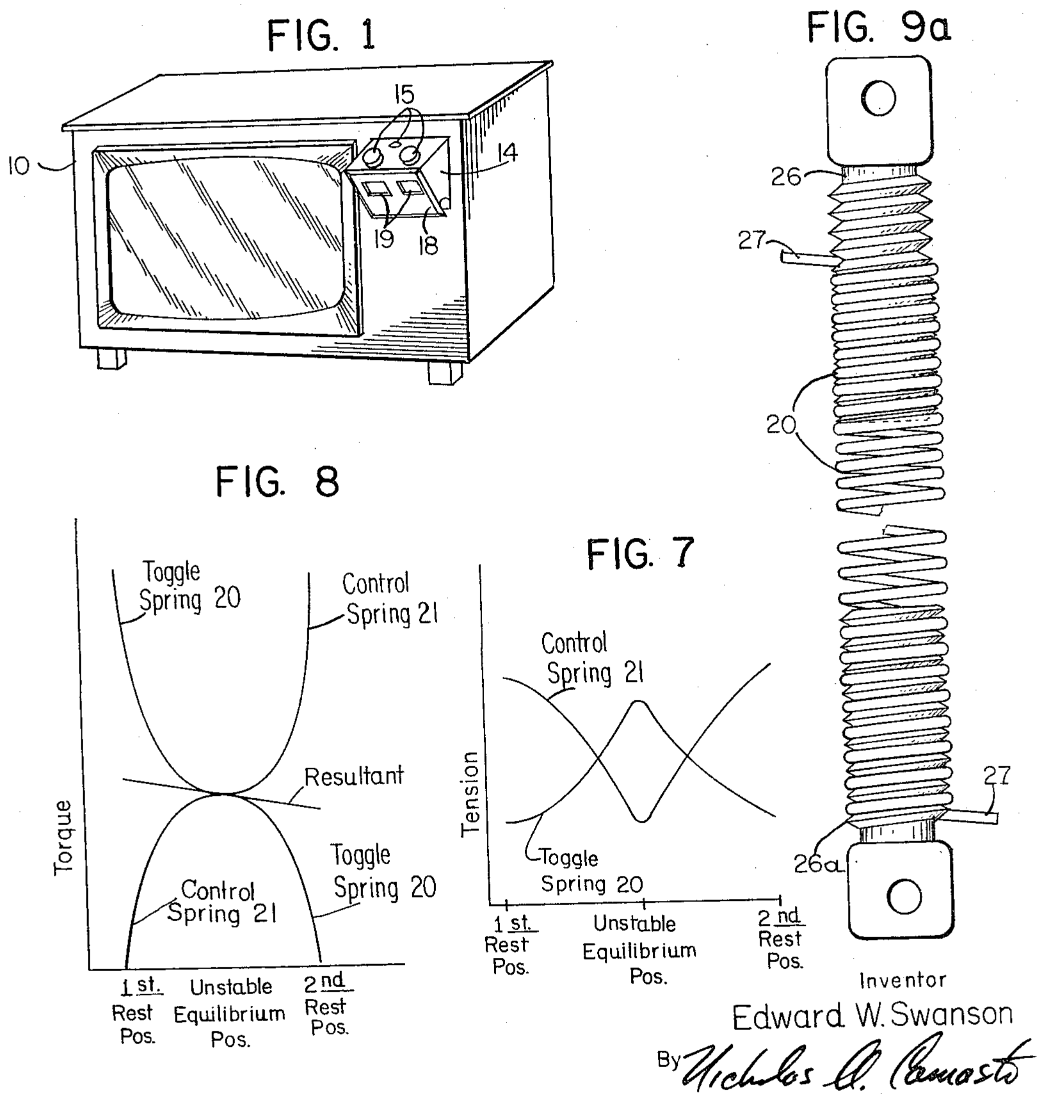
FIGURE 1 is a perspective view of a television set showing a tilt-out control panel constructed in accordance with the invention in its out position.
FIGURE 7 shows pictorially the relative tensions upon the two springs of a tilt-out control panel constructed in accordance with the invention.
FIGURE 8 shows pictorially the torque produced about the pivot point of the tilt-out control panel of the invention by each of the two springs and the weight of the tuner, and the resultant thereof.

FIGURE 9*a* shows an alternate mechanism for adjusting the tensions upon the springs within the hinge portion of a tilt-out control panel as described in the invention such that there is no necessity of disconnecting any parts of the assembly to effect said adjustment.

Referring now to FIGURE 1, a television cabinet 10 has mounted in it a tuning assembly 11 in its out position. In this position a control panel 14, affixed to tuning assembly 11, is accessible. Control panel 14 is preferably offered at an angle of about forty-five degrees to the surface of cabinet 10.

Figure 2:
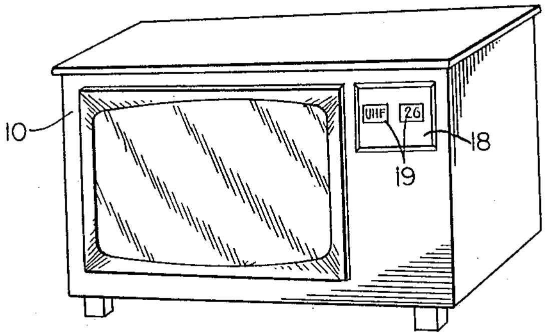
FIGURE 2 is a perspective view of a television set showing a tilt-out control panel constructed in accordance with the invention in its in position.

In FIGURE 2, tuning assembly 11 (not shown) is in its in position. A faceplate 18, which forms the front surface of tuning assembly 11, is flush with the surface of cabinet 10.

Figure 3:
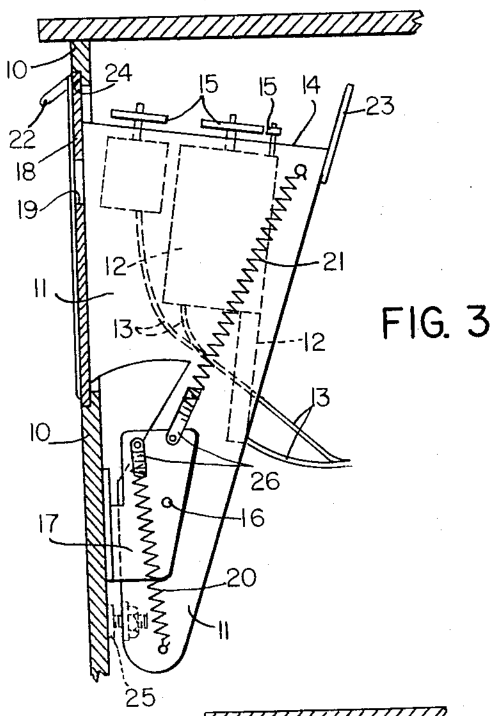
FIGURE 3 is an enlarged partial side sectional view of the television cabinet of FIGURE 1 showing a tilt-out tuning assembly constructed in accordance with the invention.

Referring now to FIGURE 3, a portion of cabinet 10 is shown containing tuning assembly 11, wherein are found tuning components 12 (shown in outline only) necessary for the tuning and operation of the television receiver. Information is carried from components 12 through a plurality of cables 13 (shown partly in outline) to various portions of the circuitry (not shown) of the television receiver. Tuning assembly 11 has control panel 14 affixed thereto with a set of knobs 15 whereby the viewer may control the various tuning components 12 within tuning assembly 11 in a well known manner. Tuning assembly 11 is pivotally mounted upon a pivot 16 of a bracket 17. Faceplate 18 has a handle 22 affixed thereto to form a hold for controlling movement of tuning assembly 11. Faceplate 18 also has apertures 19 therein displaying the channel to which the television set is tuned. Such a display may be accomplished by the use of mirrors, gears, pulleys, or the like.

A toggle spring 20 is connected between bracket 17 and tuning assembly 11 such that its line of action lies to one side of pivot 16 and such that pivot 16 is intermediate the ends of toggle spring 20. In the preferred embodiment, a control spring 21 is connected between bracket 17 and tuning assembly 11 at an end opposite to that where toggle spring 20 is connected. Consequently, the line of action of control spring 21, when extended, passes to the same side of pivot 16 as does the line of action of toggle spring 20. Control spring 21 is connected such that, as tuning assembly 11 pivots between its two rest positions, control spring 21 is extended and relaxed in correspondence with relaxation and extension of toggle spring 20. Hence the pivotal movement induced by toggle spring 20 is opposed by control spring 21.

The out position is defined as the point at which flange 23 comes into an abutting relationship with the inner surface of cabinet 10. The in position is defined as the position in which faceplate 11 comes into an abutting relationship with a receiving slot 24 cut into the outer surface of cabinet 10. Alternately, the in position can be established by positioning set screw 25 such that it comes into an abutting relationship with the inner surface of cabinet 10 when faceplate 18 is flush with cabinet 10.

Figure 4:
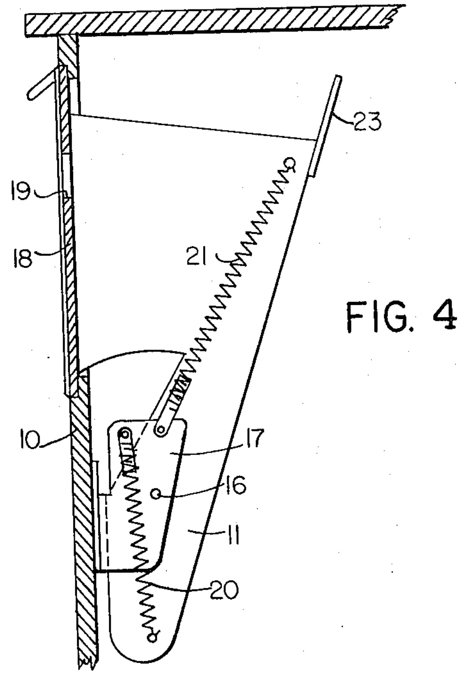
FIGURE 4 is a side sectional view of a television cabinet containing a tilt-out control panel constructed in accordance with the invention in its in position, showing only the pivot mechanism, the tuning assembly and the spring mechanisms.
Figure 5:
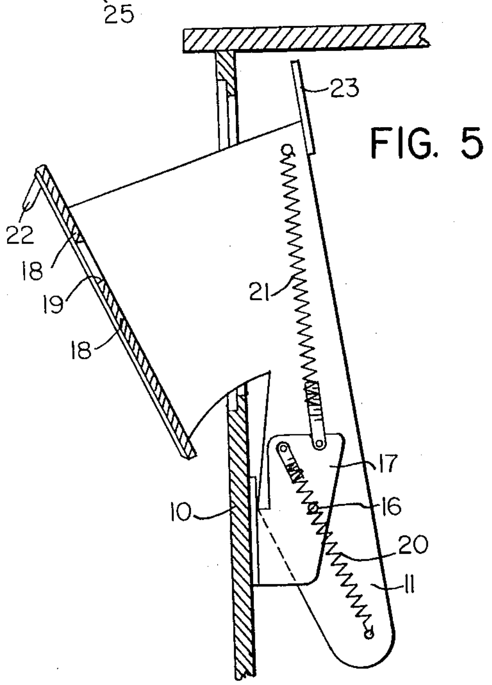
FIGURE 5 is a side sectional view of a television cabinet containing a tilt-out control panel constructed in accordance with the invention at a point midway between its in and its out positions, showing only the pivot mechanism, the tuning assembly and the spring mechanisms.
Figure 6:
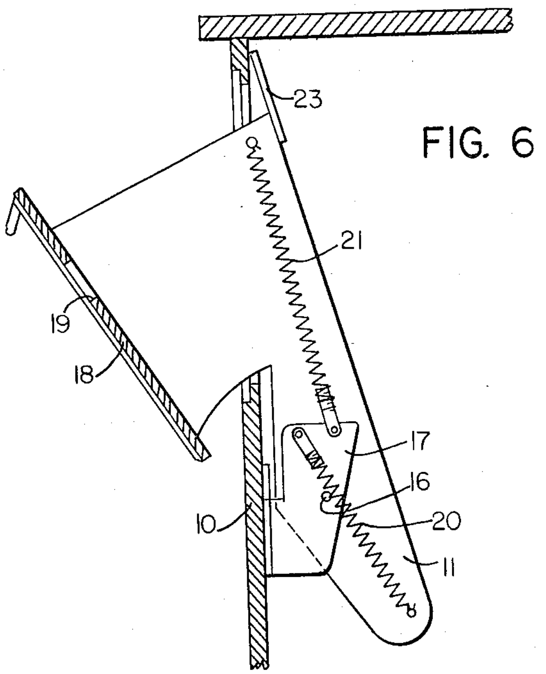
FIGURE 6 is a side sectional view of a television cabinet containing a tilt-out control panel constructed in accordance with the invention in its out position, showing only the pivot mechanism, the tuning assembly and spring mechanisms.

Referring now to FIGURES 4, 5 and 6, the relative positions of toggle spring 20 and control spring 21 are shown with tuning assembly 11, respectively, in its in position, in an intermediate position, and in its out position. When tuning assembly 11 is in its in position, as is shown in FIGURE 4, toggle spring 20 is fully relaxed, control spring 21 is fully extended and the lines of action of both lie to the left of pivot 16.

FIGURE 5 shows tuning assembly 11 in a position intermediate the in position and the out position. Toggle spring 20 is extended to its maximum and control spring 21 is relaxed. The lines of action of both these springs now pass directly through the pivot point. Toggle spring 20, although stretched to its maximum, can induce no pivotal movement in tuning assembly 11 because the force which it applies to tuning assembly 11 is directed towards the pivot point, and there is no tangential component present.

In FIGURE 6 tuning assembly 11 is in its out position. Once again toggle spring 20 is relaxed and control spring 21 is extended, but in this position both lines of action lie to the right of the pivot point.

FIGURE 7 shows pictorially the relative tensions on the two springs while tuning assembly 11 is moved from its in position to its out position. It is seen that when tuning assembly 11 is in its in position toggle spring 20 is relaxed and control spring 21 is fully extended. As the tuning assembly is moved away from its in position, which is designated as "1st rest position," the extension of toggle spring 20 is matched by a corresponding relaxation in control spring 21. Thus action continues until the tuning assembly is in a position midway between its in and its out position, which is noted in FIGURE 7 as its "unstable equilibrium position." Toggle spring 20 at this point is fully extended and control spring 21 fully relaxed. As tuning assembly 11 moves further towards its out position, which is designated as "second rest position," the tension in toggle spring 20 begins to relax, this relaxation being matched by a corresponding extension of control spring 21. When the second rest position is reached, the tensions upon the two springs are the same as were present in the first rest position.

Assuming now that tuning assembly 11 is in the position shown in FIGURE 5, that is, midway between in and out, toggle spring 20, as has previously been stated, is extended to its maximum and control spring 21 is relaxed. In this position tuning assembly 11 is in a state of unstable equilibrium, and will remain balanced in this position until a force is applied which is sufficient to move it slightly toward either rest position. Should this occur toggle spring 20, being extended, tends to pull tuning assembly 11 towards the rest position above because there is now some tangential component of force, which acts to pivot tuning assembly 11.

Were toggle spring 20 acting alone, tuning assembly 11 would gain momentum due to the force applied by toggle spring 20 and would, by the time toggle spring 20 was completely relaxed, be travelling with sufficient speed that it would travel the remaining distance to its rest position due solely to its own inertia, and would be impelled into this rest position with considerable force.

However, as toggle spring 20 acts to move tuning assembly 11 towards a rest position, control spring 21 begins to extend, which extending increases as tuning assembly 11 moves further towards said rest position. The extension of control spring 21 exerts a counterforce which increases in magnitude as the rest position is approached, tending to counteract the force exerted by toggle spring 20. Thus, when the point is reached at which toggle spring 20 is completely relaxed and is exerting no force at all upon tuning assembly 11, control spring 21 is almost completely extended, and is exerting a force nearly sufficient to prevent the force of gravity from pulling tuning assembly 11 the final minute distance into its rest position. Tuning assembly 11 will then fall gently into its rest position.

The effects of moving the assembly from either of its rest positions to the aforementioned middle position would of course be just the reverse of those previously described. Therefore, in moving tuning assembly 11 from its in position to its out position one need only pull slightly upon handle 22 of faceplate 11. The aforementioned combined effects of toggle spring 20 and control spring 21 will give the impression that tuning assembly 11 is "floating out" with the operator's hand merely guiding it.

FIGURE 8 shows the torques produced about pivot point 16 by toggle spring 20 and control spring 21. The torque produced by toggle spring 20 is taken to also include the torque produced by the weight of tuning assembly 11. It is seen that the torque caused jointly by toggle spring 20 and the weight of tuning assembly 11 is at all times sufficient to slightly overcome the opposing torque caused by control spring 21, thus insuring that the unit will stay positioned in either of its rest positions until such time that movement of the unit is desired.

Figure 9:
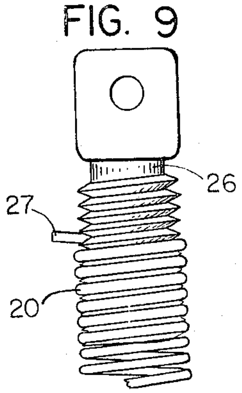
FIGURE 9 is an enlarged view of the mechanism for adjusting the tensions upon the springs within the hinge portion of a tilt-out control panel constructed in accordance with the invention.

The opposing torques caused by toggle spring 20 and control spring 21 will in time be altered, due to losses in the elasticity of the metal of the springs, which is bound to occur after a period of time. This is compensated for by providing means for adjusting the tensions in the springs. FIGURE 9 shows toggle spring 20 so adapted, and it is understood that the same mechanism will be affixed to control spring 21.

Referring now to FIGURE 9, toggle spring 20 has inserted in it a screw device 26. The pitch of screw device 26 is such that its threads are received between the coils of toggle spring 20 in the same manner that a bolt is received in a nut or similar retaining device. When it is desired to increase the tension in toggle spring 20, screw device 26 is merely disconnected from bracket 17, screwed further into toggle spring 20 and reconnected to bracket 17. Screw device 26 is locked against accidental withdrawal, because a clockwise motion applied to screw device 26 will merely tighten the pressure of the coils of toggle spring 20 around the threads of screw device 26. Thus, toggle spring 20 will be twisted with screw device 26 and screw device 26 will be prevented from unscrewing itself. The end of toggle spring 20 is bent into a lever arm 27 upon which pressure must be applied in order that the coils be manually loosened to counteract this self-locking effect and allow withdrawal of screw device 26, when such withdrawal is desired.

In order that the tensions be adjustable without the necessity of disconnecting screw device 26 from bracket 27, toggle spring 20 can have screw device 26 inserted into one of its ends, and a screw device **26*a* into the other of its ends, the pitch of screw device 26 being different from that of screw device 26*a***. This adaptation is shown in FIGURE 9*a*. To increase the tension in toggle spring 20 with such a configuration, toggle spring 20 is merely twisted such that it is unscrewed from screw device **26*a* at the same time that it is screwed onto screw device 26. The difference between the pitch of screw device 26 and the pitch of screw device 26*a* will cause, depending upon which direction toggle spring 20 is twisted, an increase or decrease in the tension in toggle spring 20**. The self-locking action previously described will, similarly, prevent any unwanted change in the tension of the spring.

With toggle spring 20 and control spring 21 so adapted, one can use the same or similar sets of springs and pivots for pivotally mounting a variety of different components, each having different weight distributions than that of tuning assembly 11. For example, one might provide also for a tilt-out tape recorder or tilt-out radio controls. One need only affix the springs to the assemblies, and then adjust their tensions to properly balance the units such that these different load conditions are compensated for.

Judicious positioning of the two springs, combined with preselecting springs with adequate elastic properties, would enable one to enhance movement of pivotally mounted structures whose size and weight is many orders of magnitude greater than that of tuning assembly 11. Indeed, the weight limitation would be set solely by the size and elastic properties of the springs available, and by the strength of the base and pivot available.

What has been described is a novel tilt-out control panel with counteracting springs to insure a smooth transition from its in position to its out position. While the invention has been described in the environment of a tilt-out control panel for a television receiver, it is understood that the invention is not to be so limited. The invention is limited only as defined in the claims.

The embodiments of the invention in which an exclusive property or privilege is claimed are defined as follows:

1. A hinge structure comprising: a base; movable means pivotally connected to said base and having a first position and a second position; first resilient means coupled to said movable means urging said movable means towards either said first position or said second position; and second resilient means coupled to said movable means opposing said urging by said first resilient means such that the force urging said movable means into either said first position or said second position is slightly greater than the opposing force exerted by said second resilient means, whereby a minimum of force is required to move said movable means between said first position and said second position.

2. A hinge structure comprising; a base; movable means having a first rest position and a second rest position; means pivotally connecting said movable means to said base; a first spring coupled to said movable means urging said movable means towards either said first rest position or said second rest position; and a second spring coupled to said movable means opposing said urging by said first spring such that the force urging said movable means into either said first rest position or said second rest position is slightly greater than the opposing force exerted by said second spring; whereby a minimum of force is required to move said movable means between said first rest position and said second rest position.

3. A hinge structure comprising: a base; movable means pivotally connected to said base, a first spring coupled to said movable means urging said movable means toward either of two rest positions; a second spring coupled to said movable means opposing said urging by said first spring such that the force urging said movable means towards either of said two rest positions is slightly greater than the opposing force exerted by said second spring; and adjusting means associated with at least one of said springs for increasing or decreasing the tensions on said one spring, whereby said first spring and said second spring enhance movement of said movable means between said two rest positions, said adjusting means enabling the same ones of said first and said second springs to be used to enhance movement of various embodiments of said movable means which differ in size and weight.

4. A hinge structure as claimed in claim 3 wherein said adjusting means comprises a threaded device received and retained within the end coils of said one spring.

5. A hinge structure as claimed in claim 3 wherein said adjusting means comprises a pair of threaded devices of different pitch, one of said pair of threaded devices received and retained within the end coils of each end of said one spring.

6. A hinge structure comprising; a base, movable means having a first position and a second position;

pivot means pivotally connecting said movable means to said base; a first spring connected between said movable means and said base such that said pivot means lies between the point of connection between said first spring and said movable means and the point of connection between said first spring and said base, said first spring urging said movable means towards either said first position or said second position; and a second spring coupled to said movable means such that the point of connection between said second spring and said base lies between said pivot means and the point of connection between said second spring and said movable means, said second spring opposing said urging of said first spring such that the force exerted by said second spring is not quite equal to the opposing force urging said movable means towards either said first position or said second position; whereby the resultant of the force exerted by said first spring and the force exerted by said second spring enhances movement of said movable means such that a minimum of force is required to move said movable means between said first position and said second position.

7. In an electronic apparatus having a control mechanism contained in a movable control unit; a base anchored to said electronic apparatus; means pivotally mounting said movable control unit to said base; and means enhancing movement of said movable control unit comprising; first resilient means coupled to said movable control unit urging said movable control unit towards either of two rest positions; and second resilient means coupled to said movable control unit opposing said urging by said first resilient means such that the force exerted by said second resilient means is not quite equal to the opposing force urging said movable control unit toward either of said two rest positions, whereby a minimum of force is required to move said movable control unit from one to the other of said two rest positions.

8. In an electronic apparatus having a control mechanism contained in a movable control unit; a base anchored to said electronic apparatus; means pivotally mounting said movable control unit to said base; and means enhancing movement of said movable control unit comprising; a first spring coupled to said movable control unit urging said movable control unit towards either of two rest positions; a second spring coupled to said movable control unit opposing said urging by said first spring such that the force urging said movable control unit towards either of said two rest positions is slightly greater than the opposing force exerted by said second spring; and adjusting means associated with said first spring and said second spring for increasing or decreasing the tensions on said first spring and said second spring, said adjusting means enabling the same ones of said first and said second springs to be used to enhance movement of various control units which differ in size and weight.

9. An electronic apparatus as claimed in claim 8 wherein said adjusting means comprises a pair of threaded devices one each being received and retained within the end coils of said first spring and said second spring, respectively.

10. In a television receiver having a tuning mechanism contained in a movable tuning module; a base anchored to said television receiver; pivot means pivotally connecting said tuning module to said base; a first spring connected between said movable tuning module and said base such that said pivot means is intermediate the ends of said first spring, said first spring urging said tuning module towards either of two rest positions; and a second spring coupled to said movable means such that the point of connection between said second spring and said base lies between said pivot means and the point of connection between said second spring and said tuning module, said second spring opposing said urging of said first spring such that the force exerted by said second spring is not quite equal to the opposing force urging said movable tuning module towards either of said two rest positions, whereby the resultant of the force exerted by said first spring and the force exerted by said second spring enhances movement of said movable tuning module such that a minimum of force is required to move said movable tuning module between said two rest positions No references cited.

DAVID G. REDINBAUGH, *Primary Examiner.*

P. SPERBER, *Assistant Examiner.*